(12) United States Patent
Sumita

(10) Patent No.: US 7,466,186 B2
(45) Date of Patent: Dec. 16, 2008

(54) SEMICONDUCTOR INTEGRATED CIRCUIT

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 514 days.

(21) Appl. No.: 11/188,656

(22) Filed: Jul. 26, 2005

(65) Prior Publication Data

US 2006/0022229 A1 Feb. 2, 2006

(30) Foreign Application Priority Data

Jul. 27, 2004 (JP) .................. P2004-218302

(51) Int. Cl.
*H03K 3/01* (2006.01)
(52) U.S. Cl. .................. 327/534; 327/537; 327/530
(58) Field of Classification Search ............ 327/530, 327/534, 535, 537, 538, 543
See application file for complete search history.

(56) References Cited

U.S. PATENT DOCUMENTS 5,461,338 A * 10/1995 Hirayama et al. .......... 327/534
5,672,995 A * 9/1997 Hirase et al. ............... 327/534
6,466,077 B1 * 10/2002 Miyazaki et al. ........... 327/534
6,778,002 B2 * 8/2004 Miyazaki et al. ........... 327/534
7,245,177 B2 * 7/2007 Fujita et al. ................ 327/543

FOREIGN PATENT DOCUMENTS

JP 2001-156261 A 6/2001

* cited by examiner

*Primary Examiner*—Lincoln Donovan
*Assistant Examiner*—Hai L. Nguyen
(74) *Attorney, Agent, or Firm*—McDermott Will & Emery LLP

(57) ABSTRACT

A semiconductor integrated circuit according to the present invention comprises an MOS substrate having a substrate region (MOS) and a source region separated from each other, a dummy MOS circuit substrate-separated from the MOS circuit and having a substrate region (dummy) and a source region (dummy) separated from each other, a substrate voltage generating circuit for generating a substrate voltage to be applied to the substrate region (MOS) and the substrate region (dummy), and a comparing circuit for measuring a current generated in the dummy MOS substrate, wherein an area ratio between the substrate region (dummy) and the source region (dummy) is substantially equal to an area ratio between the substrate region (MOS) and the source region (MOS).

12 Claims, 10 Drawing Sheets

F I G. 1
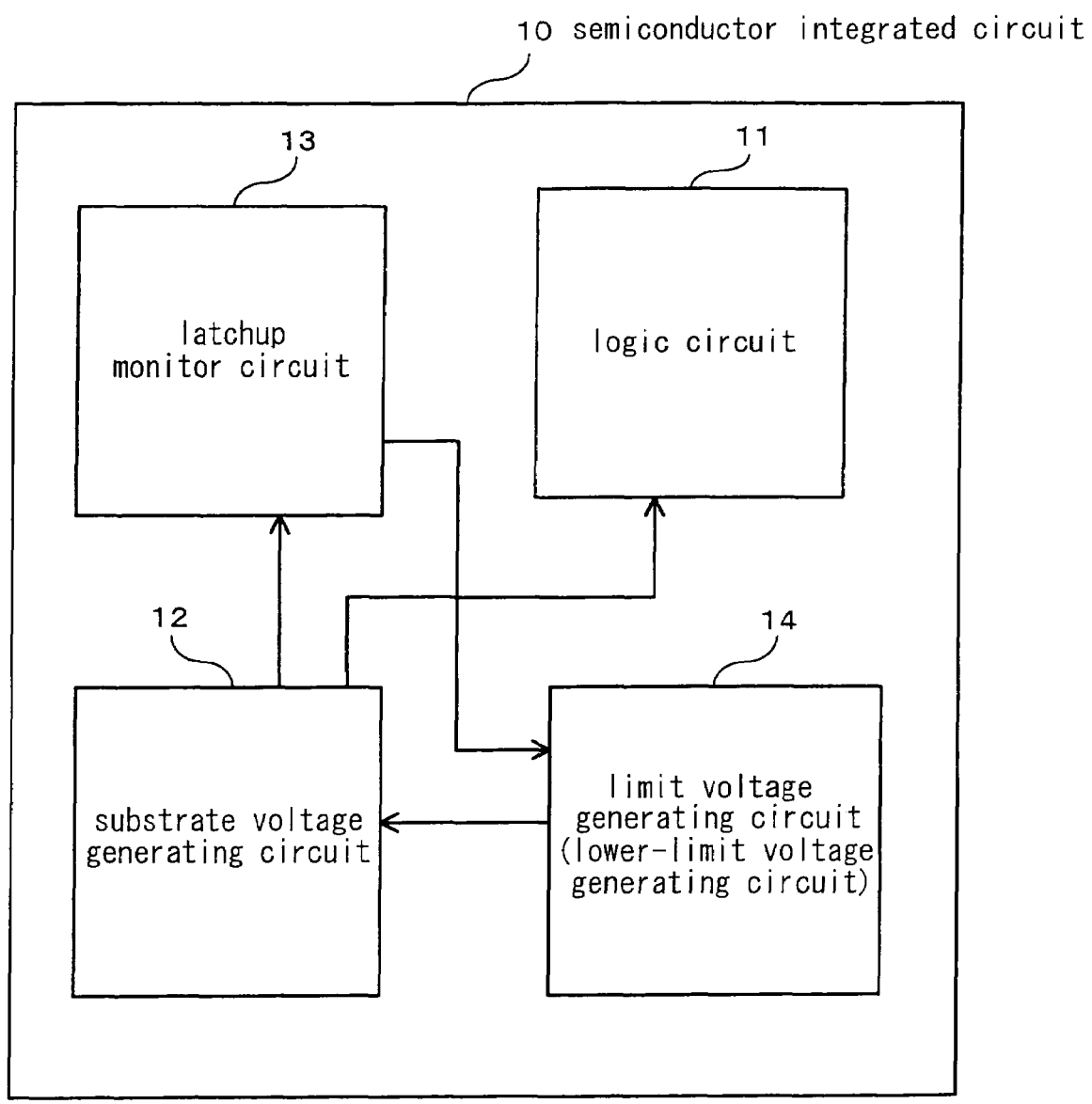

F I G. 7
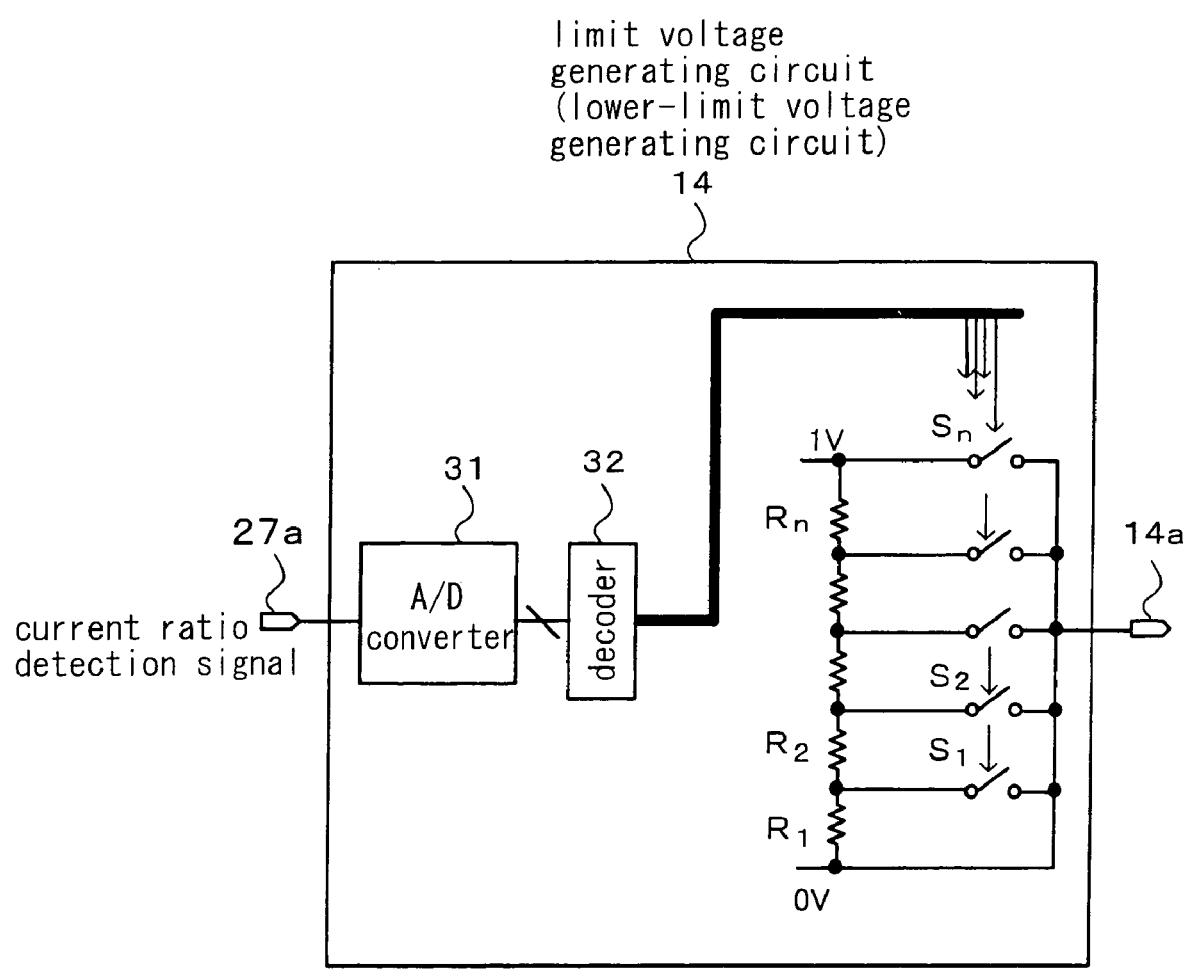

SEMICONDUCTOR INTEGRATED CIRCUIT

BACKGROUND OF THE INVENTION

1. Field of the Invention

The present invention relates to a semiconductor integrated circuit, more particularly to a technology for controlling a substrate voltage applied to an MOS (Metal Oxide Semiconductor) transistor in which a source and a substrate are separated from each other.

2. Description of the Related Art

In a CMOS transistor, there is a possibility that a latchup phenomenon is generated when a noise is applied in the state in which a substrate bias voltage is applied in a forward direction (forward bias). To describe the latchup phenomenon, a parasitic bipolar transistor (thyristor structure) remains a conducted state, in which a large current flow is constantly generated between a power-supply terminal and a ground terminal. The generation of the latchup phenomenon results in LSI breakdown and operation failure.

As a conventional method for preventing the generation of the latchup phenomenon, as shown in FIG. 9, a diode element is provided so as to control an upper limit of a substrate voltage. In the shown structure, an diode current generated in the diode element is converted into a voltage, and the voltage is compared to a predetermined threshold value so that the generated substrate bias voltage is controlled to stay below the predetermined threshold value. Such a constitution is recited in, for example, No. 2001-156261 of the Publication of the Unexamined Japanese Patent Applications (4-6, Page 19, 9, FIG. 77).

However, the current generated in the diode is variable depending on a shape thereof. Therefore, the diode does not necessarily provide a structure suitable for accurately measuring the voltage generated in a physical structure constituting a semiconductor integrated circuit. Further, because the latchup phenomenon is generated as a result of the current amplified by the thyristor structure of the bipolar transistor, the latchup phenomenon is generated in different situations depending on values of a PMOS substrate voltage and an NMOS substrate voltage. In other words, there are different situations in the case in which the forward bias is generated in the NMOS substrate alone and in the case in which the forward bias is generated in both of the NMOS and PMOS substrates. Accordingly, it was difficult to precisely control the latchup phenomenon in the conventional technology using the diode.

SUMMARY OF THE INVENTION

Therefore, a main object of the present invention is to prevent the generation of the latchup phenomenon when the substrate of the MOS transistor is subjected to the forward bias in order to attain an operation at a higher rate. A semiconductor integrated circuit according to the present invention comprises an MOS substrate having a substrate region (MOS) and a source region separated from each other, a dummy MOS circuit substrate-separated from the MOS circuit and having a substrate region (dummy) and a source region (dummy) separated from each other, a substrate voltage generating circuit for generating a substrate voltage to be applied to the substrate region (MOS) and the substrate region (dummy), and a comparing circuit for measuring a current generated in the dummy MOS substrate. An area ratio between the substrate region (dummy) and the source region (dummy) is substantially equal to an area ratio between the substrate region (MOS) and the source region (MOS).

According to the foregoing constitution, a characteristic of a parasitic bipolar transistor, that is, for example, a possibility that the latchup phenomenon is generated, can be easily and precisely observed because the dummy MOS circuit also accurately simulates the parasitic bipolar transistor of the MOS circuit to be controlled. In the foregoing manner, the latchup phenomenon and the like in the MOS circuit of a logic circuit to be controlled can be anticipated and thereby prevented.

In the semiconductor integrated circuit constituted as above, the comparing circuit preferably calculates a ratio between a current generated in the substrate region (dummy) and a current generated in the source region (dummy) and compares the calculated current ratio to a predetermined reference threshold value.

The semiconductor integrated circuit constituted as above preferably comprises a noise generator for applying a noise to at least one of the substrate region (dummy) and the source region (dummy).

According to the foregoing constitution, the noise is aggressively applied to at least one of the substrate region (dummy) and the source region (dummy) so that the latchup phenomenon and the like in the MOS circuit of the logic circuit can be detected with a more precision.

Further, a semiconductor integrated circuit according to the present invention comprises an MOS substrate having a substrate region (MOS) and a source region separated from each other, a dummy MOS circuit substrate-separated from the MOS circuit and having a substrate region (dummy) and a source region (dummy) separated from each other, a substrate voltage generating circuit for generating a substrate voltage to be applied to the substrate region (MOS) and the substrate region (dummy), and a comparing circuit for measuring a current generated in the dummy MOS substrate, wherein an area ratio (source region (dummy) area/substrate region (dummy) area) is larger than an area ratio (source region (MOS) area/substrate region (MOS) area).

According to the foregoing constitution, a physical structure increasing a ratio between a base current and a collector current is obtained. As a result, the transition to the latchup phenomenon in the dummy MOS circuit can be aggressively promoted, and the latchup phenomenon in the MOS circuit of the logic circuit can be detected with a more precision. Thereby, the precision of the detection of the latchup phenomenon can be further improved.

The semiconductor integrated circuit constituted as above further comprises a limit voltage generating circuit, wherein the limit voltage generating circuit preferably restricts the substrate voltage generated by the substrate voltage generating circuit based on a result of the comparison of the current ratio to the reference threshold value.

As a result, the latchup phenomenon and the like can be anticipated and thereby prevented at a time point when the latchup phenomenon and the like are likely to occur.

According to the present invention, the parasitic bipolar transistor in the MOS circuit of the logic circuit to be controlled can be accurately simulated, and any phenomenon generated therein can be thereby easily and precisely observed. As a result, the latchup phenomenon and the like generated in the MOS circuit can be anticipated and thereby prevented.

When the limit voltage generating circuit is adapted to restrict the substrate voltage in accordance with a ratio between the source current and the substrate current, the foregoing effect can be further assured.

Further, the semiconductor integrated circuit is adapted in such manner that an area ratio with respect to layout-shape in the dummy MOS circuit is made to be appropriate or the noise is aggressively applied to the dummy MOS circuit, the latchup phenomenon in the MOS circuit can be more precisely detected.

BRIEF DESCRIPTION OF THE DRAWINGS

These and other objects as well as advantages of the invention will become clear by the following description of a preferred embodiment and explicit in the appended claims of the invention. Many other benefits of the invention not mentioned in this specification will come to the attention of those skilled in the art upon implementing the present invention.

FIG. 1 is a block diagram illustrating a constitution of a semiconductor integrated circuit according to a preferred embodiment of the present invention.

FIG. 7 is a circuit diagram illustrating a constitution of a limit voltage generating circuit (lower-limit voltage generating circuit) according to the preferred embodiment.

DETAILED DESCRIPTION OF THE INVENTION

Figure 2:
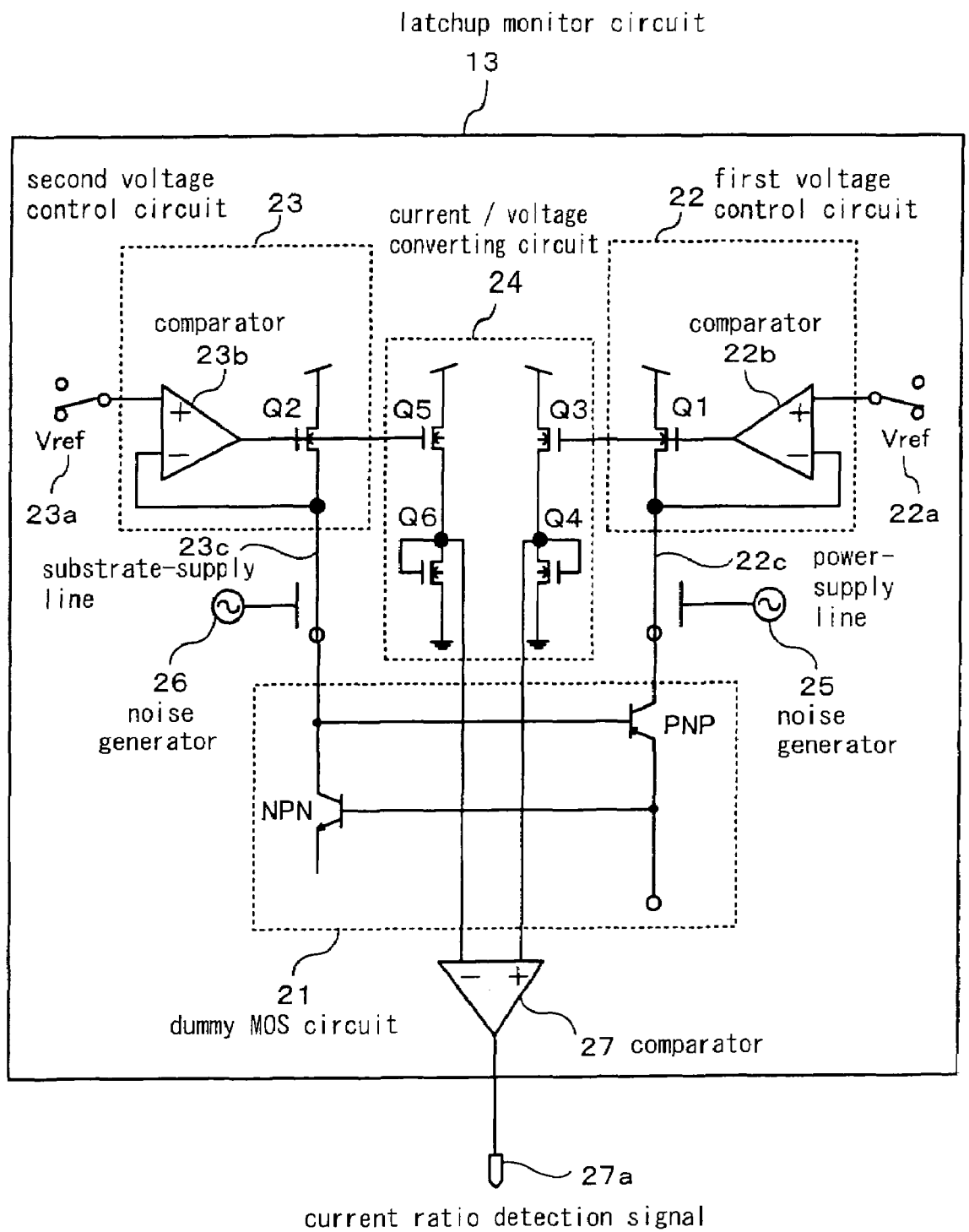
FIG. 2 is a circuit diagram illustrating a specific constitution of a latchup monitor circuit according to the preferred embodiment.

Hereinafter, a preferred embodiment of the present invention is described referring to the drawings. FIG. 1 is a block diagram illustrating a constitution of a semiconductor integrated circuit 10 according to the preferred embodiment.

The semiconductor integrated circuit 10 comprises a logic circuit 11 for realizing a function, a substrate voltage generating circuit 12, a latchup monitor circuit 13 and a limit voltage generating circuit 14.

The substrate voltage generating circuit 12 supplies a substrate voltage to a substrate of a PMOS transistor or an NMOS transistor in an MOS circuit to be controlled in the logic circuit 11. The latchup monitor circuit 13 monitors a reference voltage supplied to the MOS circuit of the logic circuit 11 from the substrate voltage generating circuit 12. The limit voltage generating circuit 14 controls a limit value of a forward-bias voltage of the substrate voltage generating circuit 12.

The limit voltage generating circuit 14 generates a lower-limit voltage for controlling a lower limit of the substrate voltage to be applied to the PMOS transistor in the case in which the MOS transistor to be controlled in the logic circuit 11 is the PMOS transistor, while generating an upper-limit voltage for controlling an upper limit of the substrate voltage to be applied to the NMOS transistor in the case in which the MOS transistor to be controlled is the NMOS transistor.

FIG. 2 is a circuit diagram illustrating an example of a specific constitution of the latchup monitor circuit 13. The latchup monitor circuit 13 comprises a dummy MOS circuit 21 which is an operation-wise accurate simulation of the MOS transistor of the logic circuit 11, a first voltage control circuit 22, a second voltage control circuit 23, a current/voltage converting circuit 24, noise generators 25 and 26, and a comparator 27 for outputting a differential from a differential amplifier or the like.

Figure 3A:
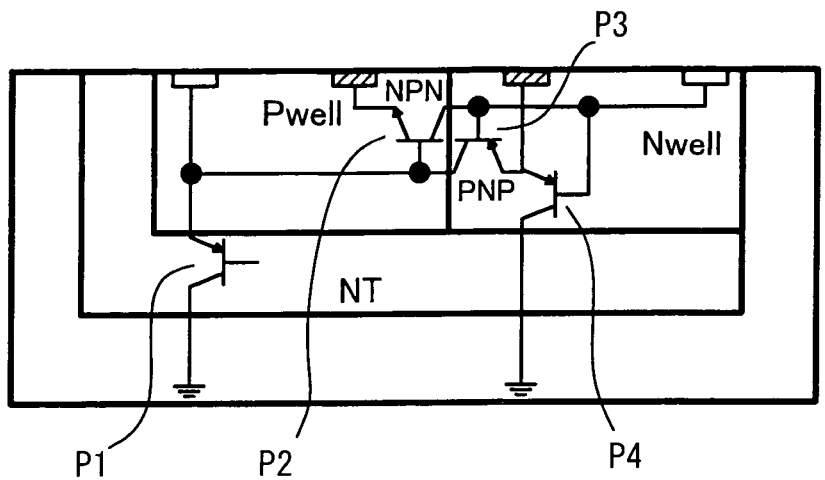
FIG. 3 are illustrations of a dummy MOS circuit according to the preferred embodiment.
Figure 3B:
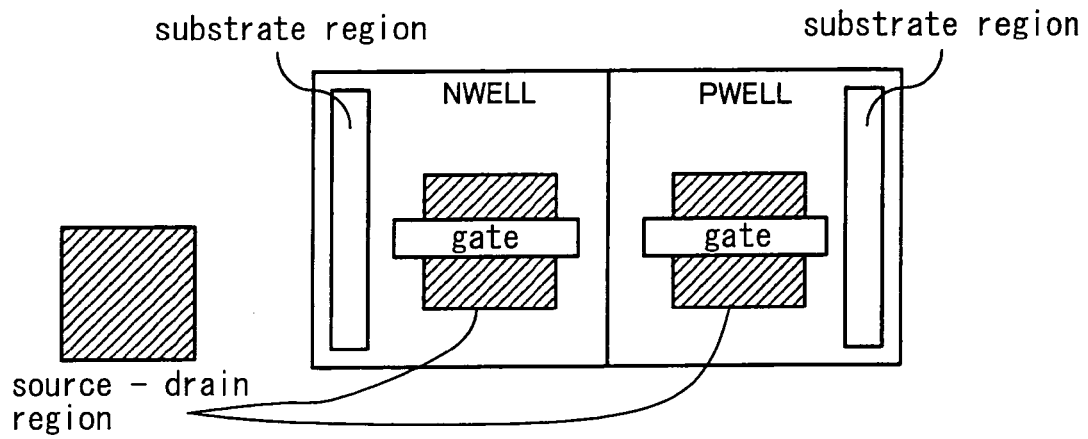
Figure 3C:
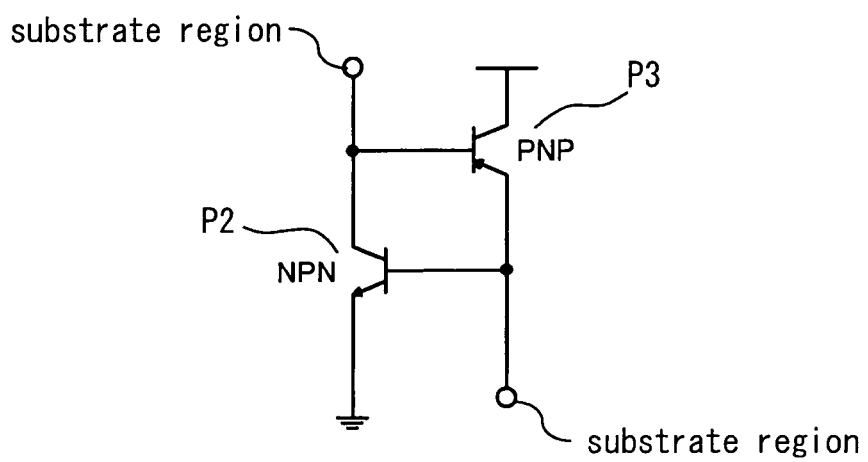

An example of the specific constitution of the dummy MOS circuit 21 is described referring to FIGS. 3A-3C and FIG. 4 and FIG. 5. FIG. 3A is a sectional view of the dummy MOS circuit 21, FIG. 3B is a plan view of the dummy MOS circuit 21, and FIG. 3C is an equivalent circuit diagram in which only horizontal elements of a parasitic bipolar transistor are extracted.

The sectional structure of the dummy MOS circuit 21 is a triple well structure, in which four parasitic bipolar transistors P1-P4 are provided. A lowermost part of the dummy MOS circuit 21 is a P substrate which is formed from silicon. Two elements P2 and P3 disposed along a horizontal direction (planar direction of the substrate) are bipolar elements which trigger the latchup phenomenon. These elements P2 and P3 are constituted as shown in FIG. 3C. The two bipolar elements P2 and P3 fall into a thyristor state when current gains thereof exceed "1", which generates the latchup phenomenon. Further, in FIG. 3B, a source-drain region on an N well is a P+ diffusion layer, while a substrate region thereon is an N+ diffusion layer as an inversion diffusion layer thereof. A source-drain region on a P well is the N+ diffusion layer, while a substrate region thereon is the P+ diffusion layer.

Figure 4:
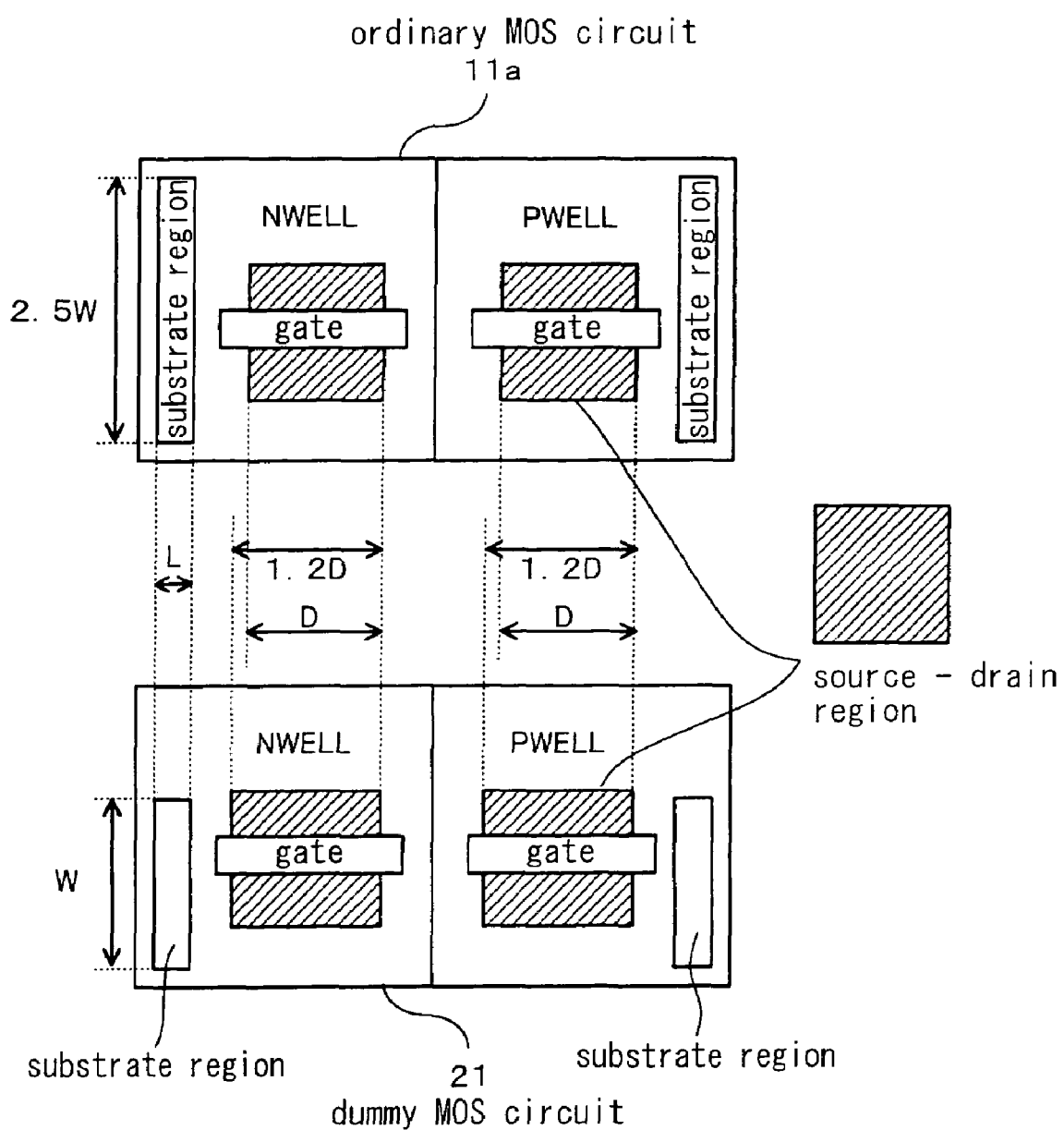
FIG. 4 is an illustration of layout-shape elements of the dummy MOS circuit according to the preferred embodiment.

FIG. 4 shows physical arrangements of an ordinary MOS circuit 11a in the logic circuit 11 and a dummy MOS circuit 21. A dimension of a substrate region (dummy) of the dummy MOS circuit 21 is represented by width (L)×length (W), while a dimension of a substrate region (MOS) of the ordinary MOS circuit 11a is represented by width (L)×length (2.5 W), which shows that the substrate region (dummy) of the dummy MOS circuit 21 is formed in the size smaller than the size of the substrate region (MOS) of the ordinary MOS circuit 11a. Further, a source-drain region (MOS)) of the ordinary MOS circuit 11a has the width of D, while a source-drain region (dummy) of the dummy MOS circuit 21 has the width of 1.2 D, which shows that the source-drain region (dummy) of the dummy MOS circuit 21 is formed in the size larger than the size of the source-drain region (MOS) of the ordinary MOS circuit 11. More specifically, in terms of the parasitic bipolar transistor, the dummy MOS circuit 21 has a base area smaller than that of the ordinary MOS circuit 11a and has emitter and collector areas larger than those of the ordinary MOS circuit 11a. Accordingly, the parasitic bipolar transistor resulting from the physical arrangement of the dummy MOS circuit 21 achieves a current gain larger than that of the parasitic bipolar transistor resulting from the physical arrangement of the ordinary MOS circuit 11a. In the layout-shape elements of the dummy MOS circuit 21, an area ratio of the substrate region and the source region (source region (dummy) area/substrate region (dummy) area) is set to be larger than an area ratio of the substrate region and the source region (source region (MOS) area/substrate region (MOS) area) in the ordinary MOS circuit 11a in order to monitor the latchup phenomenon in the ordinary MOS circuit 11a at a higher rate and with a higher precision.

Figure 5:
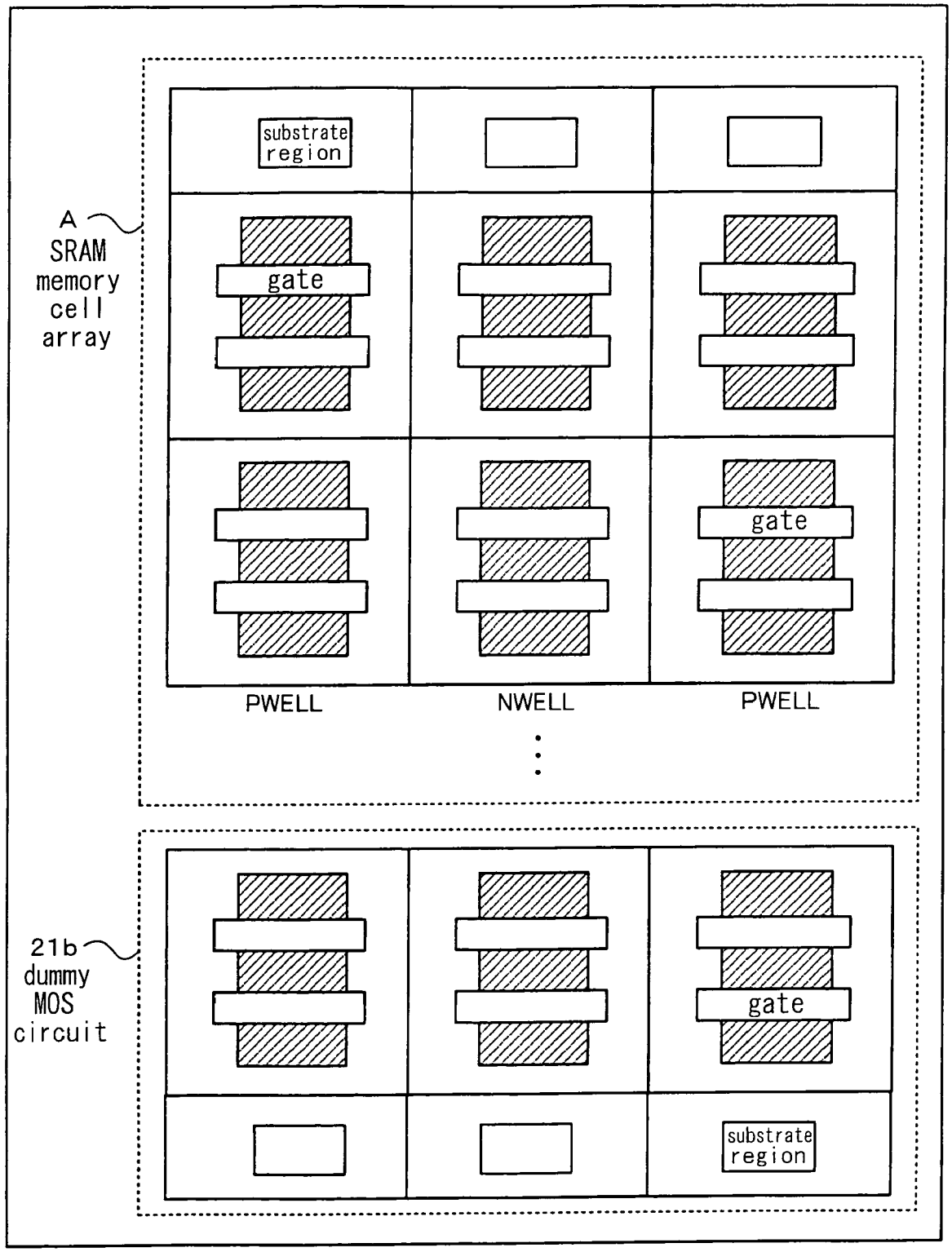
FIG. 5 is an illustration of another example of the dummy MOS circuit according to the preferred embodiment.
Figure 6:
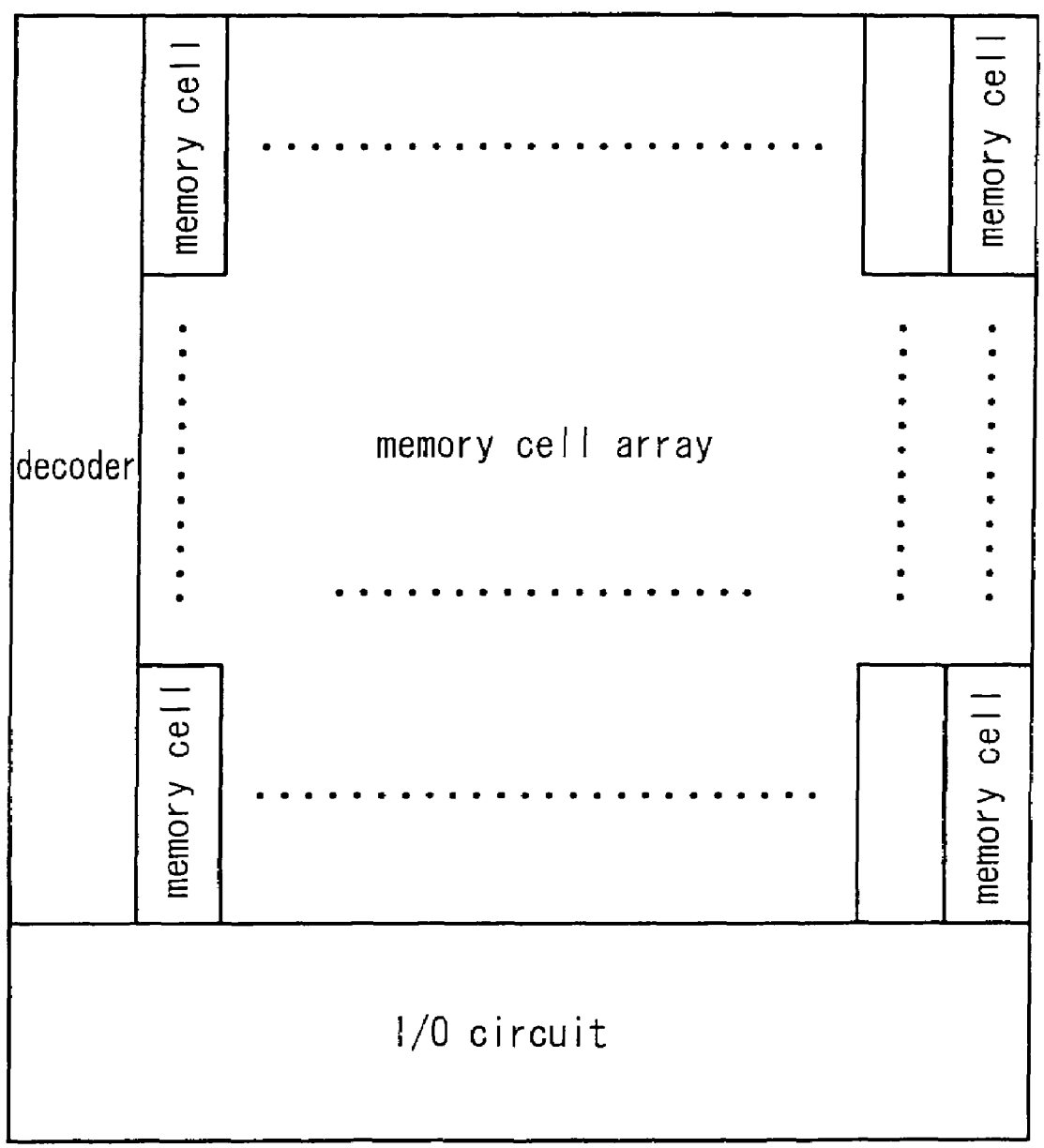
FIG. 6 shows a layout of a SRAM circuit according to the preferred embodiment.

However, the respective area ratios may be arranged to be equal, which enables the latchup phenomenon in the ordinary MOS circuit 11a to be monitored in the same manner. FIG. 5 shows a physical layout of a dummy MOS circuit 21b having a same shape as a memory array in a memory cell array A in a layout of an SRAM circuit shown in FIG. 6. In the case of FIG. 5, the source-drain region and the substrate region respectively have a same shape and a same dimension in the memory cell array and the dummy MOS circuit.

Referring to FIG. 2 again, the constitution of the latchup monitor circuit 13 is described in detail.

The first voltage control circuit 22 comprises a comparator 22b for outputting a differential and an MOS transistor Q1 of Nch. A reference voltage 22a is applied to a non-inversion input terminal (+) of the comparator 22b. The reference voltage 22a corresponds to a power-supply voltage for operating the MOS transistor in the logic circuit 11. A source of the transistor Q1 is feedback-connected to an inversion input terminal (−) of the comparator 22b. Accordingly, the first voltage control circuit 22 has such a feedback structure that a voltage value of a power-supply line 22c is maintained at a constant level. The power-supply line 22c of the first voltage control circuit 22 is connected to a PNP transistor of the dummy MOS circuit 21.

The second voltage control circuit 23 comprises a comparator 23b for outputting a differential and an MOS transistor Q2 of Nch. A reference voltage 23a is applied to a non-inversion input terminal (+) of the comparator 23b. The reference voltage 23a corresponds to a substrate potential of the MOS transistor in the logic circuit 11. A source of the transistor Q2 is feedback-connected to an inversion input terminal (−) of the comparator 23b. Accordingly, the second voltage control circuit 23 has such a feedback structure that a voltage value of a substrate-supply line 23c is maintained at a constant level. The substrate-supply line 23c of the second voltage control circuit 23 is connected to an NPN transistor of the dummy MOS circuit 21.

The noise generator 25 is capacitance-coupled with respect to the power-supply line 22c, and the noise generator 26 is capacitance-coupled with respect to the substrate-supply line 23c. When the noise generators 25 and 26 are provided, the noise is aggressively applied to the dummy MOS circuit 21 so that the latchup phenomenon in the MOS circuit of the logic circuit 11 can be more precisely detected. In the foregoing case, signal waveforms of the noise generators 25 and 26 are desirably reverse to each other. More desirably, a thyristor time constant is synchronized with the noise generators 25 and 26.

The current/voltage converting circuit 24 comprises MOS transistors Q3, Q4, Q5 and Q6 of Nch. An output terminal of the comparator 22b in the first voltage control circuit 22 is connected to gates of the transistors Q1 and Q3. A drain of the transistor Q3 is connected to the transistor Q4 and also connected to a non-inversion input terminal (+) of the differential-outputting comparator 27. The transistor Q4 is formed into a diode structure and thereby causes a voltage drop.

An output terminal of the comparator 23b in the second voltage control circuit 23 is connected to gates of the transistors Q2 and Q5. A drain of the transistor Q5 is connected to the transistor Q6 and also connected to an inversion input terminal (−) of the comparator 27. The transistor Q6 is formed into the diode structure and thereby causes the voltage drop.

An output terminal 27a of the comparator 27 is connected to the limit voltage generating circuit 14 and thereby transmits a current ratio detection signal to the limit voltage generating circuit 14. Sources of the transistors Q1 and Q3 are connected to a potential common with that of sources of the transistors Q2 and Q5. Sources of the transistors Q4 and Q6 are grounded. The sources of the transistors Q1 and Q3 and the sources of the transistors Q2 and Q5 are not necessarily connected to the common potential and may be respectively connected to different potentials.

As a countermeasure for controlling a variation in the elements, the transistors Q1, Q2, Q3 and Q5 all have a same size. Further, the transistors Q4 and Q6 also preferably have a same size. However, the foregoing components may not necessarily have the same size when the variation in some degree can be allowed.

The source current of the MOS transistor in the logic circuit 11 shows a value reflecting the power-supply current of the dummy MOS circuit 21. The source current of the dummy MOS circuit 21 is converted by the transistors Q3 and Q4 of the current/voltage converting circuit 24 into a voltage value in accordance with the current volumes thereof.

The substrate current of the MOS transistor in the logic circuit 11 show a value reflecting the substrate current of the dummy MOS circuit 21. The substrate current of the dummy MOS circuit 21 is converted by the transistors Q5 and Q6 of the current/voltage converting circuit 24 into a voltage value in accordance with the current volumes thereof.

The two voltage values obtained in the current/voltage conversions by the current/voltage converting circuit 24 are inputted to the comparator 27 for the arithmetic of a ratio (substrate current/power-supply current). As the ratio (substrate current/power-supply current) between the two voltage values (respectively corresponding to the source current and the substrate current of the dummy MOS substrate 21) obtained in the arithmetic is larger, the comparator 27 increases a value of the current ratio detection signal outputted from the output terminal 27a.

The bipolar element P2 and P3 constituting the dummy MOS circuit 21 fall into the thyristor state when the current gains thereof exceed "1" as described earlier, which generates the latchup phenomenon. Focusing on the characteristic, the possibility of the generation of the latchup phenomenon in the dummy MOS circuit 21 and the possibility of the generation of the latchup phenomenon in the MOS circuit 11a can be estimated based on the current ratio detection signal outputted from the comparator 27. Below is given a detailed description.

The comparator 27 calculates the ratio (substrate current/power-supply current) between the power-supply current and the substrate current (power-supply current−substrate current) in the dummy MOS circuit 21 so that the current gains of the bipolar elements P2 and P3 are monitored. As long as the ratio (substrate current/power-supply current) is equal to or below a predetermined value, the current gains of the bipolar elements P2 and P3 do not exceed "1", and the latchup phenomenon is not generated in the dummy MOS circuit 21 (MOS circuit 11a).

When the ratio (substrate current/power-supply current) is equal to or more than the predetermined value, the current gains of the bipolar elements P2 and P3 are equal to or over "1", and the latchup phenomenon is generated in the dummy MOS circuit 21 (MOS circuit 11a). As the value of the ratio (substrate current/power-supply current) is increased, the latchup phenomenon is more likely to be generated.

As described, when the output of the comparator 27 (current ratio detection signal) is monitored, the possibility of the generation of the latchup phenomenon in the MOS circuit 11a can be indirectly monitored. In the comparator 27, the predetermined value in the ratio (substrate current/power-supply current) serves as a reference threshold value.

FIG. 7 is a circuit diagram of the limit voltage generating circuit 14. The limit voltage generating circuit 14 comprises an A/D converter 31, a decoder 32, a ladder resistor, switch elements $S_1, S_2, \ldots S_n$. The A/D converter 31 has "n" number of quantization steps and is provided with a data retaining function. The A/D converter 31 A/D converts the output of the comparator 27 (current ratio detection signal). Further, the A/D converter 31 lessens the output data value as the inputted current ratio detection signal is smaller, while increasing the output data value as the inputted current ratio detection signal is larger.

As a result, the current ratio detection signal is A/D converted to a larger value as the possibility of the generation of the latchup phenomenon is higher.

The decoder 32 is comprised of a decoder of n bits and decodes the output of the A/D converter 31. The ladder resistor comprises a plurality of resistance elements $R_1, R_2, \ldots R_n$ having an identical resistance value and serially connected to one another. One ends of the plurality of switch elements $S_1, S_2, \ldots S_n$ are connected to connecting points among the respective resistance elements $R_1, R_2, \ldots R_n$, while another ends thereof are commonly connected to a limit voltage output terminal 14a. The switch elements S1, S2, ... $S_n$ are turned on/off in accordance with the output of the decoder 32 and supplied with a larger voltage as the output of the A/D converter 31 increases.

Both end voltages of the ladder resistor are respectively a maximum voltage (1 v) and a minimum voltage (0V) The both end voltage may employ optional values, however, the maximum voltage (power-supply value) 1V voltage-adjusted by the ladder resistor preferably corresponds to a power-supply voltage value for operating the MOS circuit in the logic circuit 11.

The substrate voltage generating circuit 12 supplies the substrate voltage to the MOS transistor of the logic circuit 11 and the latchup monitor circuit 13. Further, a limit voltage instruction signal is inputted to the substrate voltage generating circuit 12 from the limit voltage output terminal 14a of the limit voltage generating circuit 14, and a limit voltage of the substrate voltage to be supplied to the logic circuit 11 is controlled based on the limit voltage instruction signal.

The limit voltage generating circuit 14 generates a lower-limit voltage instruction signal when the control object in the logic circuit 11 is the PMOS transistor, while generating an upper-limit voltage instruction signal when the control object in the logic circuit 11 is the NMOS transistor.

Figure 8:
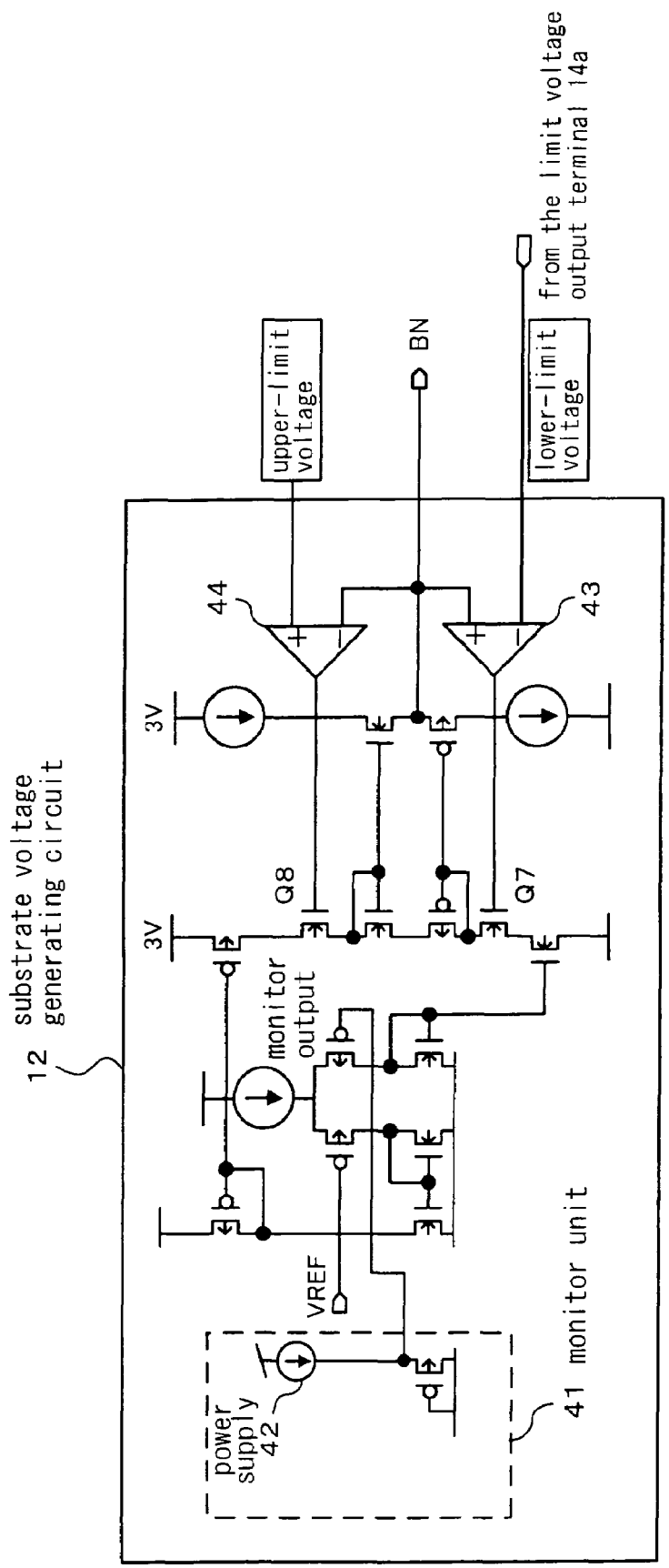
FIG. 8 is a circuit diagram illustrating a constitution of a substrate voltage generating circuit according to the preferred embodiment.

FIG. 8 shows an example of a specific constitution of the substrate voltage generating circuit 12. The substrate voltage generating circuit 12 compares a monitor output of a monitor unit 41 and a VREF reference voltage to each other to thereby generate a substrate voltage BN in accordance with a current value of a power supply 42. The substrate voltage generating circuit 12 supplies the generated substrate voltage BN to the substrate of the MOS transistor in the logic circuit 11 and the latchup monitor circuit 13. At that time, the substrate voltage generating circuit 12 restricts a value of the substrate voltage BN based on the limit voltage instruction signal inputted from the limit voltage generating circuit 14.

Next is described an operation of an semiconductor integrated circuit according to the present embodiment constituted as so far described. The description is based on the assumption that the MOS circuit to be controlled in the logic circuit 11 is the PMOS transistor.

Figure 9A:
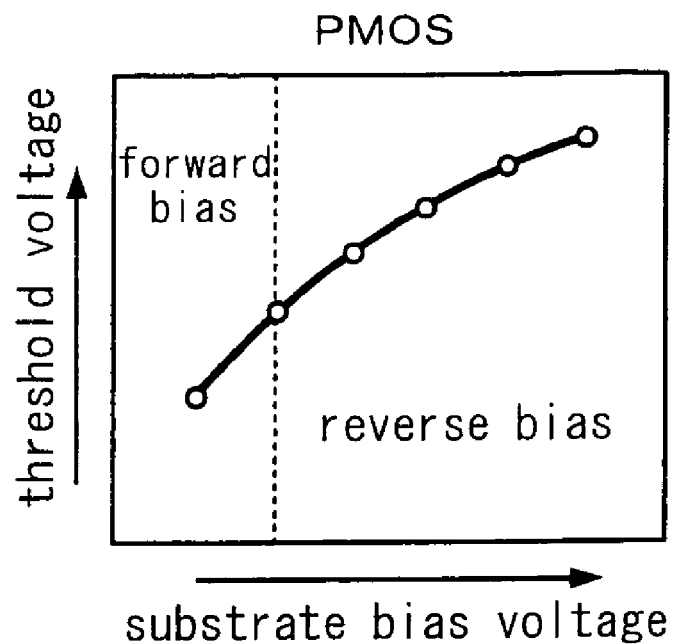
FIG. 9 are substrate bias voltage-threshold voltage plots of a PMOS transistor and an NMOS transistor.
Figure 9B:
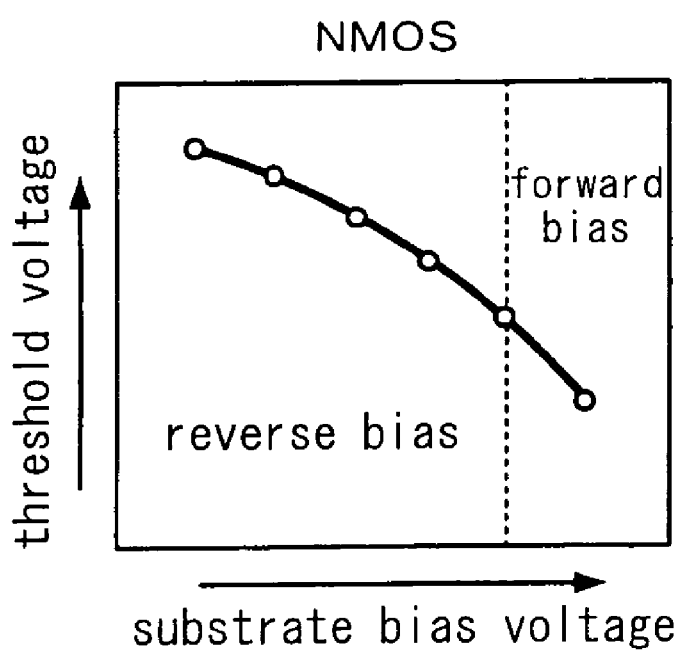
Figure 10:
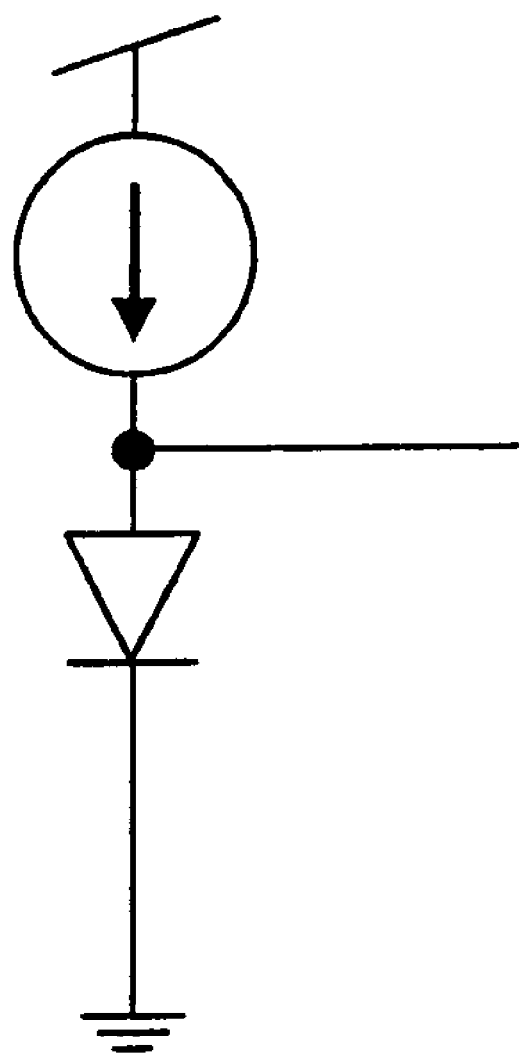
FIG. 10 is an illustration of a current/voltage converting circuit according to a conventional technology.

FIGS. 9A and 9B are substrate bias voltage-threshold voltage plots. As shown in FIG. 9A, in the PMOS transistor, PN junction is biased in a forward direction, the threshold voltage is lowered, and the operation is accelerated when the substrate potential is lower than the source potential. In the NMOS transistor, on the other hand, the PN junction is biased in a forward direction, the threshold voltage is lowered, and the operation is accelerated when the substrate potential is higher than the source potential as shown in FIG. 9B. In both of the PMOS and NMOS transistors, the latchup phenomenon is more likely to occur at the time of the forward bias in which the threshold voltage is lessened.

The substrate voltage is supplied to the substrate of the PMOS transistor in the logic circuit 11 from the substrate voltage generating circuit 12. The substrate voltage is also supplied to latchup monitor circuit 13. The latchup monitor circuit 13 monitors the operation of the dummy MOS circuit 21 therein to thereby monitor the generation status of the latchup phenomenon in the logic circuit 11. Below is given a detailed description.

The current running through the PNP transistor of the dummy MOS circuit 21 corresponds to a power-supply voltage VDD of the PMOS transistor in the logic circuit 11. Based on the correspondence, the current running through the PNP transistor of the dummy MOS circuit 21 is detected by the transistor Q1 of the first voltage control circuit 22, and the detected current value is converted into the voltage by the transistors Q3 and Q4 of the current/voltage converting circuit 24. The voltage, which is thus converted, corresponds to the power-supply voltage VDD of the PMOS transistor in the logic circuit 11.

The current running through the NPN transistor of the dummy MOS circuit 21 correspond to the substrate voltage of the PMOS transistor in the logic circuit 11. Based on the correspondence, the current running through the NPN transistor of the dummy MOS circuit 21 is detected by the transistor Q2 of the second voltage control circuit 22, and the detected current value is converted into the voltage by the transistors Q5 and Q6 of the current/voltage converting circuit 24. The voltage, which is thus converted, corresponds to the substrate voltage of the PMOS transistor of the logic circuit 11

The voltage outputted from the transistors Q3 and Q4 (=power-supply voltage VDD) is applied to the non-inversion input terminal (+) of the comparator 27. The voltage outputted from the transistors Q5 and Q6 (=substrate voltage BN) is applied to the inversion input terminal (−) of the comparator 27.

The comparator 27 calculates the ratio (substrate current/power-supply current) between the inputted two voltages and outputs a result of the calculation as the current ratio detection signal to the limit voltage generating circuit 14. The limit voltage generating circuit 14 lessens the output data value of the A/D converter 31 as the value of the inputted current ratio detection signal is smaller, while increasing the output data value of the A/D converter 31 as the value of the current ratio detection signal is larger.

As a result, the decoder 32 shift-controls an ON/OFF turning point (resistance setting point at which ladder resistor is effective) of a switch element Si (I=1, 2, . . . n) which is ON-controlled. Therefore, as the value of the current ratio detection signal is smaller, the output data value of the A/D converter 31 is reduced. Correspondingly, the ON/OFF turning point of the switch element Si is shifted to be closer to the minimum voltage (0V).

As the resistance dividing point of the ladder resistor is more and more approximate to the minimum voltage (0V), the limit voltage (lower-limit voltage) outputted from the limit voltage output terminal 14a is lowered. The limit voltage (lower-limit voltage) is thus feedback-controlled and supplied to the substrate voltage generating circuit 12.

The limit voltage (lower-limit voltage) indicates a lower-limit regulation value of the forward-bias substrate voltage supplied to the PMOS transistor in the logic circuit 11. The substrate voltage generating circuit 12 sets the lower-limit regulation value of the forward-bias substrate voltage based on the supplied limit voltage (lower-limit voltage). The, the substrate voltage generating circuit 12 shifts the lower-limit regulation value of the forward-bias substrate voltage to be lower because the limit voltage (lower-limit voltage) is lowered. Accordingly, an allowance level of a range, in which the supplied substrate voltage is shifted, extends to the lower side. As a result, the supplied substrate voltage is further shifted downward, which further promotes a higher rate in operating the PMOS transistor. In this case, there is no risk of generating the latchup phenomenon.

On the contrary, the output data value of the A/D converter 31 is smaller as the value of the current ratio detection signal is larger. As a result, the ON/OFF turning point of the switch element Si is shifted to be closer to the maximum voltage (1V).

As the resistance dividing point of the ladder resistor is more and more approximate to the maximum voltage (1V), the limit voltage outputted from the limit voltage output terminal 14a (lower-limit voltage) is increased. The limit voltage (lower-limit voltage) is thus feedback-controlled and supplied to the substrate voltage generating circuit 12.

The substrate voltage generating circuit 12 shifts the lower-limit regulation value of the forward-bias substrate voltage to the higher side because the limit voltage (lower-limit voltage) is higher. Thereby, the allowance level of the range, in which the supplied substrate voltage is shifted, extends to the higher side. Then, the range in which the supplied substrate voltage is shifted downward (allowance level) is narrowed, as a result of which the downward shift of the supplied substrate voltage when the PMOS transistor is operated at a higher rate is restricted.

When the lower-limit voltage applied to an inversion input terminal (−) of a comparator 43 exceeds the substrate voltage BN applied to a non-inversion input terminal (+) thereof, an output of the comparator 43 approaches an "L" level, in response to which the current value of the NMOS transistor Q7 is reduced. Then, the value of the substrate voltage BN is no longer lowered. As a result, the latchup phenomenon in the PMOS transistor to be controlled in the logic circuit 11 can be prevented. In the foregoing manner, the forward-bias supplied substrate voltage is shifted as downward as possible so that a higher rate is promoted in the operation of the PMOS transistor, while a stable operation is also ensured because the latchup phenomenon is unfailingly prevented.

It is more effective for preventing the generation of the latchup phenomenon when the two noise generators 25 and 26 are adapted to generate voltages having phases opposite to each other.

The foregoing description of the operation is based on that the PMOS transistor is the control object, however, the NMOS transistor may be used as the control object, in which case the operation logic is reversed in such manner that the limit voltage generating circuit 14 is adapted to generate the upper-limit voltage in place of generating the lower-limit voltage. In the case of the constitution, the substrate voltage generating circuit 12 narrows a range in which the substrate voltage supplied to the NMOS transistor is shifted upward (allowance level) so that the latchup phenomenon can be effectively prevented. More specifically, the forward-bias supplied substrate voltage is shifted as upward as possible (upper-limit value side) so that a higher rate is promoted in the operation of the NMOS transistor, while a stable operation is also ensured because the latchup phenomenon can be unfailingly prevented.

The semiconductor integrated circuit according to the present invention is very effective as a technology for preventing the latchup phenomenon when the forward bias voltage is applied to the substrate of the MOS circuit in which the substrate and the source are separated from each other in order to attain a high-rate operation, and further, can be applied to a chip set using the semiconductor chip and the like.

For example, the specification of the present invention described the constitution in which the dummy MOS substrate was used to monitor the possibility of the generation of the latchup phenomenon, however, the dummy MOS circuit may not be necessarily used. As an alternative constitution, the possibility of the generation of the latchup phenomenon may be monitored using an MOS transistor for executing an actual operation during a period when the operation is not executed.

Further, the present invention may not be limitedly used for preventing the latchup phenomenon and effectively used in other uses. For example, when a large substrate voltage is excessively applied to a forward side (voltage on a side on which the MOS transistor is operated at a higher rate), an overall current consumption exponentially starts to increase at and beyond a voltage value. Therefore, when the ratio between the current value of the substrate region and the current value of the source region is controlled to stay within a predetermined range, the operation of the MOS transistor can achieve a higher rate within the range of a specified current consumption.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor integrated circuit comprising:
   a MOS circuit having a substrate region (MOS) and a source region (MOS) separated from each other;
   a dummy MOS circuit substrate-separated from the MOS circuit and having a substrate region (dummy) and a source region (dummy) separated from each other;
   a substrate voltage generating circuit for generating a substrate voltage to be applied to the substrate region (MOS) and the substrate region (dummy); and
   a comparator for comparing two voltage values respectively corresponding to a source current and a substrate current of the dummy MOS circuit, wherein
   an area ratio between the substrate region (dummy) and the source region (dummy) is substantially equal to an area ratio between the substrate region (MOS) and the source region (MOS).

2. A semiconductor integrated circuit as claimed in claim 1, Wherein the comparator increases a value of a current ratio detection signal outputted from the comparator according to a difference between the two voltage values respectively corresponding to a source current and a substrate current of the dummy MOS circuit.

3. A semiconductor integrated circuit as claimed in claim 1, further comprising a noise generator for applying a noise to at least one of the substrate region (dummy) and the source region (dummy).

4. A semiconductor integrated circuit as claimed in claim 1, further comprising a limit voltage generating circuit, wherein the limit voltage generating circuit restricts the substrate voltage generated by the substrate voltage generating circuit based on a result of the comparison of the two voltage values respectively corresponding to the source current and the substrate current of the dummy MOS circuit.

5. A semiconductor integrated circuit as claimed in claim 4, wherein the MOS circuit comprises a PMOS transistor, and the limit voltage generating circuit restricts a lower-limit voltage of a substrate voltage of the PMOS transistor based on the result of the comparison of the two voltage values respectively corresponding to the source current and the substrate current of the dummy MOS circuit.

6. A semiconductor integrated circuit as claimed in claim 4, wherein the MOS circuit comprises an NMOS transistor, and the limit voltage generating circuit restricts an upper-limit voltage of a substrate voltage of the NMOS transistor based on the result of the comparison of the two voltage values respectively corresponding to the source current and the substrate current of the dummy MOS circuit.

7. A semiconductor integrated circuit as claimed in claim 4, wherein the MOS circuit is a circuit including a PMOS transistor and an NMOS transistor, and the limit voltage generating circuit restricts a lower-limit voltage of a substrate voltage of the PMOS transistor and restricts an upper-limit voltage of a substrate voltage of the NMOS transistor based on the result of the comparison of the two voltage values respectively corresponding to the source current and the substrate current of the dummy MOS circuit.

8. A semiconductor integrated circuit as claimed in claim 1, wherein the MOS circuit is a memory cell.

9. A semiconductor integrated circuit comprising:

a MOS circuit having a substrate region (MOS) and a source region (MOS) separated from each other;

a dummy MOS circuit substrate-separated from the MOS circuit and having a substrate region (dummy) and a source region (dummy) separated from each other;

a substrate voltage generating circuit for generating a substrate voltage to be applied to the substrate region (MOS) and the substrate region (dummy); and a comparator for comparing two voltage values respectively corresponding to a source current and a substrate current of the dummy MOS circuit, wherein an area ratio (source region (dummy) area/substrate region (dummy) area) is larger than an area ratio (source region (MOS) area/substrate region (MOS) area).

10. A semiconductor integrated circuit as claimed in claim 9, wherein the comparator increases a value of a current ratio detection signal outputted from the comparator according to a difference between the two voltage values respectively corresponding to a source current and a substrate current of the dummy MOS circuit.

11. A semiconductor integrated circuit as claimed in claim 9, further comprising a noise generator for applying a noise to at least one of the substrate region (dummy) and the source region (dummy).

12. A semiconductor integrated circuit as claimed in claim 9, further comprising a limit voltage generating circuit, wherein the limit voltage generating circuit restricts the substrate voltage generated by the substrate voltage generating circuit based on a result of the comparison of the two voltage values respectively corresponding to the source current and the substrate current of the dummy MOS circuit.

* * * * *